(12) United States Patent
Wu et al.

(10) Patent No.: US 9,324,718 B2
(45) Date of Patent: Apr. 26, 2016

(54) THREE DIMENSIONAL MULTILAYER CIRCUIT

(75) Inventors: Wei Wu, Palo Alto, CA (US); R. Stanley Williams, Portola Valley, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 13/260,019

(22) PCT Filed: Jan. 29, 2010

(86) PCT No.: PCT/US2010/022489
§ 371 (c)(1),
(2), (4) Date: Sep. 23, 2011

(87) PCT Pub. No.: WO2011/093863
PCT Pub. Date: Aug. 4, 2011

(65) Prior Publication Data
US 2012/0280282 A1 Nov. 8, 2012

(51) Int. Cl.
*H01L 25/00* (2006.01)
*H03K 19/177* (2006.01)
*H01L 21/46* (2006.01)
*H01L 21/4763* (2006.01)
*H01L 27/10* (2006.01)
*H01L 27/02* (2006.01)
*H01L 27/06* (2006.01)
*H01L 27/24* (2006.01)

(52) U.S. Cl.
CPC .......... *H01L 27/101* (2013.01); *H01L 27/0207* (2013.01); *H01L 27/0688* (2013.01); *H01L 27/24* (2013.01)

(58) Field of Classification Search
CPC . H01L 45/1233; H01L 27/2463; H01L 45/08; H01L 45/085; H01L 27/2481
USPC .................... 257/E21.575; 438/598
See application file for complete search history.

(56) References Cited

U.S. PATENT DOCUMENTS 3,318,993 A    5/1967  Beelitz
3,953,924 A    5/1976  Zachry et al.
(Continued)

OTHER PUBLICATIONS

Herrick, Katherine et al, "Interconnects for a Multi-Layer Three-Dimensional Silicon Architecture", Retrieved Nov. 30, 2015, 4 Pages.
(Continued)

*Primary Examiner* — Mary Wilczewski
*Assistant Examiner* — Tsz Chiu
(74) *Attorney, Agent, or Firm* — Van Cott, Bagley, Cornwall & McCarthy

(57) ABSTRACT

A three dimensional multilayer circuit (600) includes a plurality of crossbar arrays (512) made up of intersecting crossbar segments (410, 420) and programmable crosspoint devices (514) interposed between the intersecting crossbar segments (410, 420). Shift pins (505, 510) are used to shift connection domains (430) of the intersecting crossbar segments (410, 420) between stacked crossbar arrays (512) such that the programmable crosspoint devices (514) are uniquely addressed. The shift pins (505, 510) make electrical connections between crossbar arrays (512) by passing vertically between crossbar segments (410, 510) in the first crossbar array (512) and crossbar segments in a second crossbar array. A method for transforming multilayer circuits is also described.

13 Claims, 12 Drawing Sheets

(56) References Cited

U.S. PATENT DOCUMENTS

| | | | |
|---|---|---|---|
| 4,328,531 A | 5/1982 | Nagashima et al. | |
| 4,772,864 A | 9/1988 | Otto et al. | |
| 4,891,789 A | 1/1990 | Quattrini et al. | |
| 4,980,034 A | 12/1990 | Volfson et al. | |
| 5,473,120 A | 12/1995 | Ito et al. | |
| 5,640,761 A | 6/1997 | DiStefano et al. | |
| 5,976,393 A | 11/1999 | Abe | |
| 6,256,767 B1 | 7/2001 | Kuekes et al. | |
| 6,525,275 B1 | 2/2003 | Asai | |
| 6,574,113 B2 | 6/2003 | Armezzani et al. | |
| 6,735,104 B2 | 5/2004 | Scheuerlein | |
| 6,836,424 B2 | 12/2004 | Segal et al. | |
| 6,870,264 B2 | 3/2005 | Iwaki et al. | |
| 6,906,940 B1 | 6/2005 | Lue | |
| 6,963,077 B2 | 11/2005 | DeHon et al. | |
| 6,965,137 B2 | 11/2005 | Kinney et al. | |
| 6,992,255 B2 | 1/2006 | Oprysko et al. | |
| 7,073,157 B2* | 7/2006 | DeHon et al. | 716/30 |
| 7,112,815 B2* | 9/2006 | Prall | 257/2 |
| 7,122,746 B2 | 10/2006 | Higuchi et al. | |
| 7,157,305 B2 | 1/2007 | Prall | |
| 7,202,566 B2* | 4/2007 | Liaw | 257/758 |
| 7,221,614 B2 | 5/2007 | Saito et al. | |
| 7,292,498 B2 | 11/2007 | Snider | |
| 7,310,004 B2 | 12/2007 | DeHon | |
| 7,338,896 B2* | 3/2008 | Vanhaelemeersch et al. | 438/638 |
| 7,342,413 B2 | 3/2008 | Mouttet | |
| 7,352,067 B2 | 4/2008 | Fukaishi et al. | |
| 7,393,739 B2 | 7/2008 | Gopalakrishnan et al. | |
| 7,692,309 B2* | 4/2010 | Cox | 257/776 |
| 2005/0055387 A1* | 3/2005 | Kuekes et al. | 708/1 |
| 2005/0063373 A1 | 3/2005 | DeHon et al. | |
| 2005/0167787 A1 | 8/2005 | Fricke et al. | |
| 2006/0240681 A1 | 10/2006 | Williams et al. | |
| 2007/0126474 A1 | 6/2007 | Chang et al. | |
| 2007/0229111 A1* | 10/2007 | Mouttet | 326/39 |
| 2007/0233761 A1* | 10/2007 | Mouttet | 708/204 |
| 2008/0089110 A1* | 4/2008 | Robinett et al. | 365/148 |
| 2009/0296362 A1 | 12/2009 | Okano | |
| 2010/0159688 A1* | 6/2010 | Rinerson et al. | 438/598 |
| 2010/0211720 A1* | 8/2010 | Satpathy et al. | 710/317 |

OTHER PUBLICATIONS

International Searching Authority, The International Search Report and the Written Opinion, Oct. 11, 2010, 10 Pages.

Lee, M.J et al, "Stack Friendly all-oxide 3D RRAM using GaInZnO Peripheral TFT realized over Glass Substrates", 2008, pp. 85-88, IEEE.

Snider, Gregory et al, "Nano/CMOS architectures using a field-programmabie nanowire interconnect", Nanotechnology, 2007, vol. 18, 11 Pages.

Strukov, Dmitri B et al "Four-dimensional address topology for circuits with stacked multilayer crossbar arrays", Sep. 22, 2009, 4 Pages.

* cited by examiner

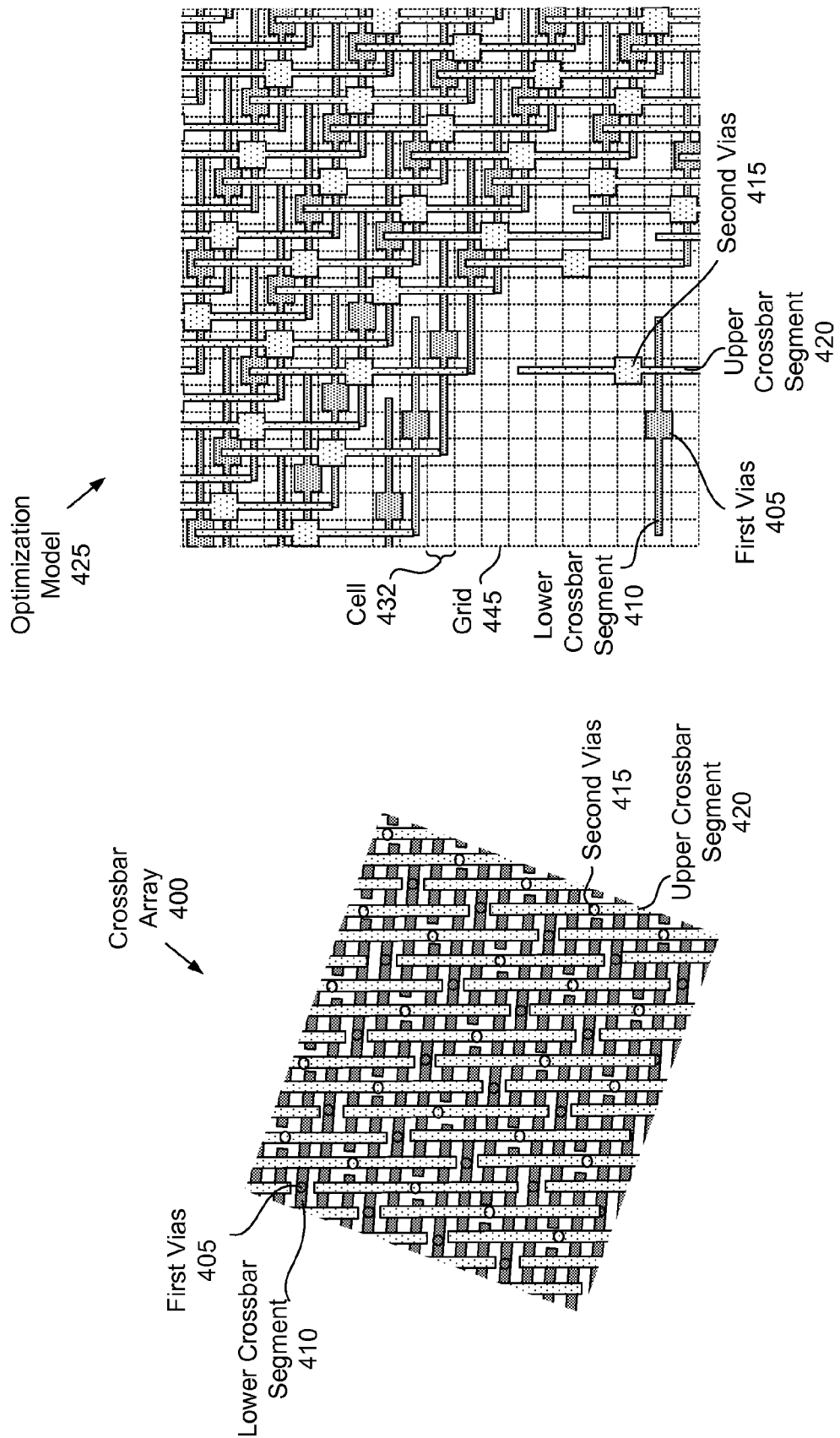

| Parameter | | Description |
|---|---|---|
| 450-1 Unit Cell |  | Square: can contain only a via, a crossbar, or an intersection |
| 450-2 Vias | 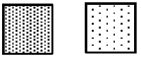 | No restrictions on relative locations of vias. |
| 450-3 Crossbar | 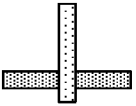 | Upper Crossbar: always vertical<br>Lower Crossbar: always horizontal |
| 450-4 Via/Crossbar connection |  | Via interconnection anywhere along crossbar length |
| 450-5 Crossbar Intersection |  | Maximize intersections over crossbar length |
| 450-6 Crossbar length |  | Same for upper and lower crossbars, displayed at 9 units long |
| 450-7 Shift pin for upper crossbar |  | Anywhere along upper crossbar length |
| 450-8 Shift pin for lower crossbar |  | Anywhere along lower crossbar length |
| 450-9 Connection Domain |  | Maximize connection domain size in a given layer |
| 450-10 Shifted Connection Domain | 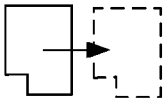 | Maximize new connections in shifted connection domain |

THREE DIMENSIONAL MULTILAYER CIRCUIT

FEDERALLY SPONSORED RESEARCH

This work has been partially funded by the Intelligence Advanced Research Projects Agency (IAEPA) under the Semiconductor-Nanowire Interconnect Project. The United States Government may have rights to this invention.

BACKGROUND

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 4A is a diagram which shows an illustrative embodiment of a segmented crossbar array, according to one embodiment of principles described herein.

FIGS. 4B and 4C are diagrams of an illustrative model of the segmented crossbar array of FIG. 4A, according to one embodiment of principles described herein.

FIG. 4D is a chart listing parameters within an illustrative model for transforming interconnections in a multilayer circuit, according to one embodiment of principles described herein.

Throughout the drawings, identical reference numbers designate similar, but not necessarily identical, elements.

DETAILED DESCRIPTION

Figure 1:
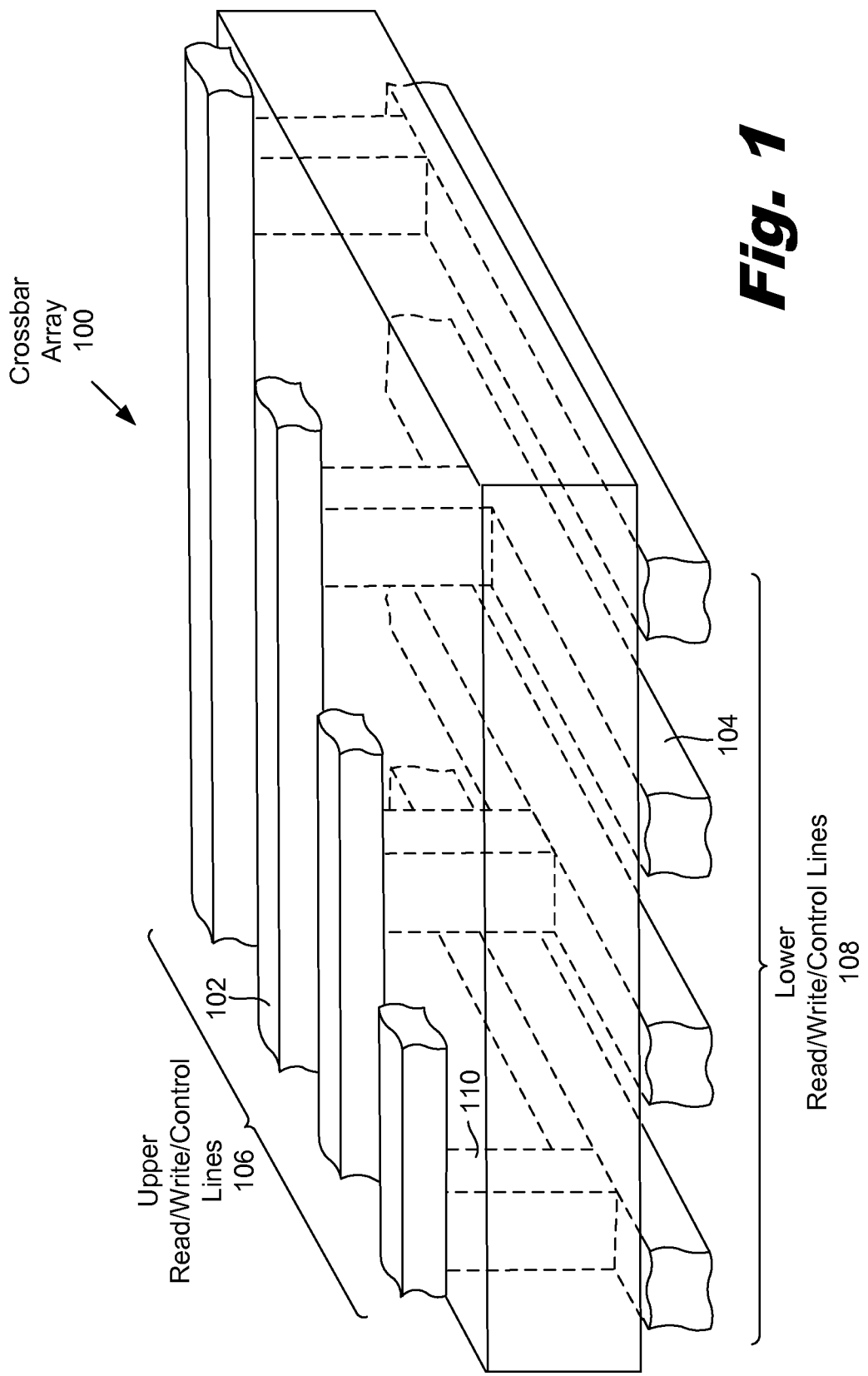
FIG. 1 is a perspective view of an illustrative crossbar array, according to one embodiment of principles described herein.

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

A methodology for transforming interconnections between multiple crossbar layers in a three dimensional circuit is described. To provide a concrete example of this methodology, the starting point for making optimized transformations is a multilayer circuit (hereinafter, the "Strukov circuit" or the "Strukov embodiment") described in PCT Application No. PCT/US2009/039666, to Dmitri Strukov et al., entitled "Three Dimensional Multilayer Circuit," filed Apr. 6, 2009, which is incorporated by reference in its entirety. In the Strukov embodiment, the elements in higher crossbar levels are uniquely addressed by shifting the vertical vias using a special intercrossbar wiring layer. This intercrossbar shifting layer increases the complexity of the circuit and adds to the manufacturing cost because of the extra physical mask(s) and additional steps which form the intercrossbar shifting layer. For example, the additional steps may include lithography steps, material deposition and polishing.

A method for transforming interconnections within a multilayer circuit, together with a number of illustrative examples of transformed multilayer circuits, is described. These transformed three dimensional multilayer circuits provide simplified interconnection routing and dense addressing without any intercrossbar wiring layers. For example, by changing the location of the interlayer vias and wire geometry in the crossbars, the crossbar crossbars themselves can be used to shift the connection domain of a via. This transformed structure keeps the major advantage of the Strukov circuit—the four-dimensional logical address space for connecting to the individual devices in the stack of crossbars. The transformed structures make the design simpler, use fewer lithograph masks and steps, significantly lower the manufacturing costs, and also increase the circuit manufacturing yield and operating reliability by having fewer connections. This can result in three dimensional circuits which provide higher density in digital memories, dramatically improve the density of field programmable logic, and have significant applications in bio-inspired adaptive circuitry.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

As used in the specification and appended claims, a crossbar array includes a set of upper crossbar wires, a set of lower crossbar wires which intersect the upper crossbar wires at a non-zero angle, and programmable crosspoint devices interposed between the wires at the intersections.

FIG. 1 is a diagram of an illustrative crossbar array (100). The crossbar array (100) includes upper crossbar wires (106) which are generally parallel. In this illustrative embodiment, a second group of lower crossbar wires (108) are substantially perpendicular to and intersect the first group of lines (106). According to one illustrative embodiment, programmable crosspoint devices (110) are formed between intersecting lines. The programmable crosspoint devices (110) may be configured in a variety of ways. For example, the programmable crosspoint devices (110) may be configured as programmable fuses or as part of a neural network. In some embodiments, the programmable crosspoint devices (110) may be configured as memory elements. The crossbar array (100) may include a variety of different types of programmable crosspoint devices (110) to accomplish its function. For example, crossbar architecture can be used to form implication logic structures and crossbar based adaptive circuits such as artificial neural networks. The crossbar array (100) has several advantages over conventional circuitry including higher density and/or occupying less planar area.

According to one illustrative embodiment, the programmable crosspoint devices (110) are memristive devices. Memristive devices are described in U.S. Patent App. Pub. No. 2008/0079029, entitled "Multi-terminal Electrically Actuated Switch" and U.S. Patent App. Pub. No. 2008/009033, entitled "Electrically Actuated Switch", both to R. Stanley Williams, which are hereby incorporated in their entirety. Additionally or alternatively, the programmable crosspoint devices (110) may include memcapacitive devices. Various illustrative embodiments of memcapacitive devices are described in PCT Application No. PCT/US2009/047164 to Dmitri Strukov et al., entitled "Capacitive Crossbar Arrays" filed Jun. 12, 2009, which is incorporated by reference in its entirety.

Memristive devices exhibit a "memory" of past electrical conditions. For example, a memristive device may include a matrix material which contains mobile dopants. These dopants can be moved within a matrix to dynamically alter the electrical operation of an electrical device. The motion of dopants can be induced by the application of a programming electrical voltage across a suitable matrix. The programming voltage generates a relatively high electrical field through the memristive matrix and alters the distribution of dopants within the matrix. After removal of the electrical field, the location and characteristics of the dopants remain stable until the application of another programming electrical field. These changing dopant configurations within a matrix produce changes in the electrical resistance or other characteristics of the device.

The memristive device can be read by applying a lower reading voltage which allows the internal electrical resistance of the memristive device to be sensed but does not generate a high enough electrical field to cause significant dopant motion. According to one illustrative embodiment, the memristive device exhibits a rectifying behavior similar to Schottky diode. The state of the memristive device can be read by applying a full forward voltage bias across a specified junction while reverse biasing other memristive devices in the array to suppress leakage currents.

Each of the memristive crosspoint devices (110) may be used to represent one or more bits of data. For example, in the simplest case, memristive crosspoint devices (110) may have two states: a conductive state and a nonconductive state. The conductive state may represent a binary "1" and the nonconductive state may represent a binary "0", or vise versa. Binary data can be written into the crossbar architecture (100) by changing the conductive state of the memristive crosspoint devices (110). The binary data can then be retrieved by sensing the state of the memristive crosspoint devices (110). Additionally or alternatively, the crossbar array (100) can incorporate memristive crosspoint devices (110) which have more than two states.

Throughout the specifications and appended claims, the term "programmable crosspoint device" refers to a broad family of devices or technologies which provide the ability to program and sense state changes in devices which are interposed between intersecting conductive elements. The term "memristive device" or "memristor" refers to a specific type of programmable crosspoint device which uses dopant motion within a matrix to alter the resistive state of the device.

According to one illustrative embodiment, a crossbar memory array may be integrated with complimentary metal-oxide-semiconductor (CMOS) or other conventional computer circuitry. This CMOS circuitry can provide additional functionality to the memristive device such as input/output functions, buffering, logic, or other functionality.

Figure 2:
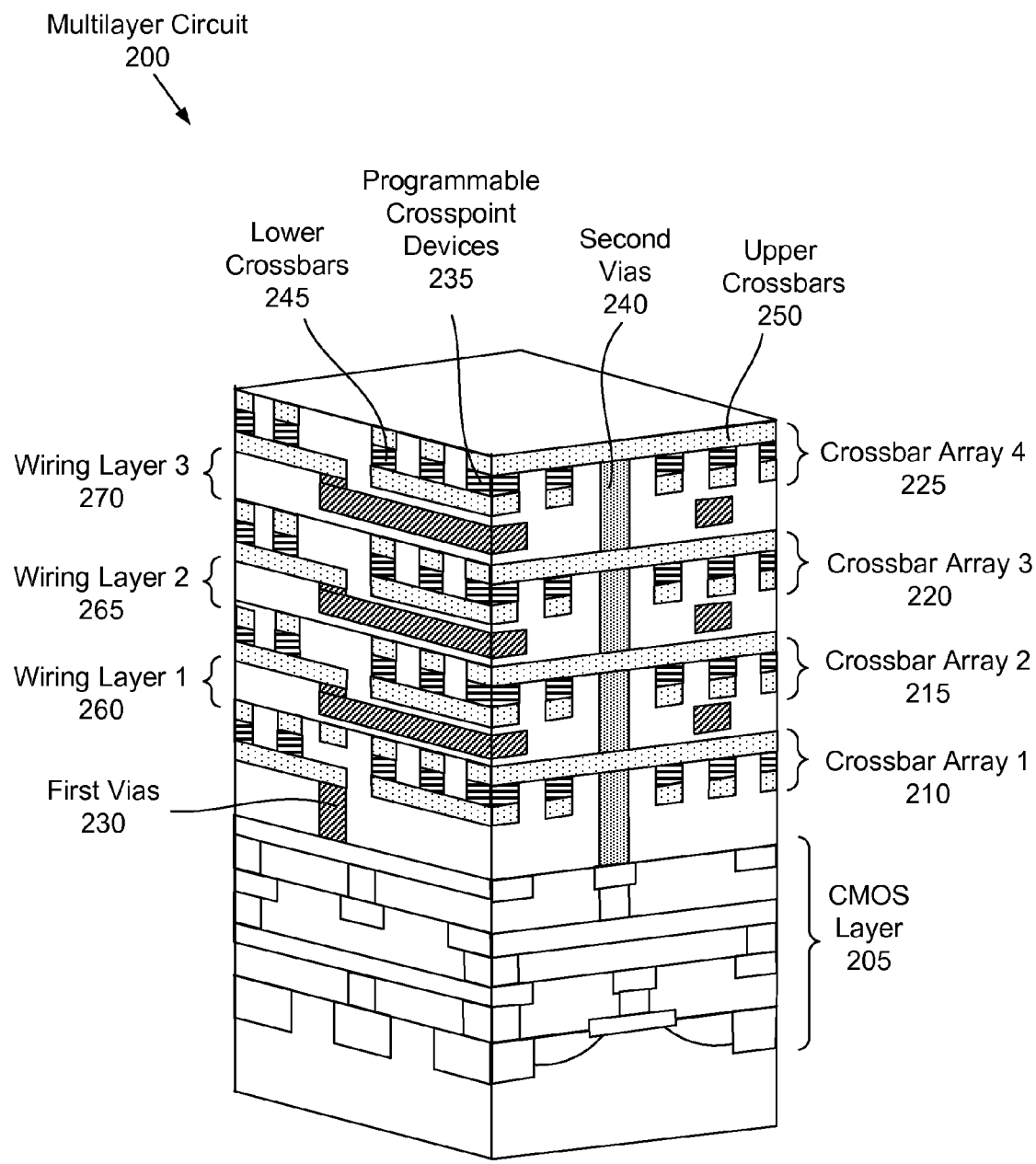
FIG. 2 is a diagram showing a cross-section of an illustrative multilayer circuit which includes a number of crossbar arrays and a complimentary metal-oxide-semiconductor (CMOS) layer, according to one embodiment of principles described herein.

FIG. 2 is a diagram showing an illustrative three dimensional multilayer circuit (200) which includes a CMOS layer (205) and a number of overlying crossbar arrays (210, 215, 220, 225). For example, the crossbar array 4 (225) contains a set of upper crossbar lines (250), a set of lower crossbar lines (245), and a number of programmable crosspoint devices (235) interposed between the upper crossbar lines (250) and the lower crossbar lines (245). The crossbar array (225) is electrically connected to the underlying CMOS layer (205) by two groups of vias (230, 240). The first vias (230) connect to the lower crossbar lines (245) within each crossbar array (210, 215, 220, 225). A second group of vias (240) connects to the upper crossbar lines (250) within each crossbar array (210, 215, 220, 225).

The CMOS layer (205) may be either "area distributed" or "peripherally distributed." An "area distributed" CMOS layer (205) is illustrated in FIG. 2. Area distributed CMOS circuitry typically contacts the target circuitry over its bottom surface. The area distributed CMOS circuitry may have several distinct advantages over contacting the target circuitry only around its periphery. In peripherally distributed CMOS circuitry, the density at which the CMOS circuitry can be packed around the target circuit can become a limiting factor in the circuit layout. In contrast, area distributed CMOS circuitry typically underlies the target circuitry and can occupy as much room as the target circuit without increasing the required planar area of the combined circuit. Additionally, by connecting the CMOS circuitry to the overlying target circuit using vias, long connection traces are avoided. By avoiding long connection traces which are inherent in peripherally distributed configurations, the planar size and line capacitances of the circuit can be minimized. In particular, the length electrical interconnection between area distributed CMOS layer and the overlying crossbar arrays can be significantly reduced. This makes capacitance and resistance of the electrical interconnections, which makes write and read functions faster and lower energy. In some embodiments, an area distributed CMOS layer may reduce the number of programmable crosspoint devices which are connected to each electrical interconnection, thus decreasing possible leakage current.

Optimizing routing in a multilayer circuit is a three dimensional design problem with multiple parameters which can be considered. For large scale designs, the connections can consume a large portion of the available space. The challenge of routing the interconnections from the vias to the various crossbars is to uniquely address each programmable crosspoint device while consuming minimal space and adding minimal complexity. Ideally, a relatively small number of vias could be used to address all of the programmable crosspoint devices and there would be no gaps in the physical address space multilayer circuit. Further, it is desirable that the number of vias in lower crossbar layers would remain the same when additional overlying crossbar layers are added to the multilayer circuit. To accomplish these objectives and overcome other limitations of interconnections in three dimensional multilayer circuits, a method for transforming interconnections to form an optimized circuit can be used.

Figure 3:
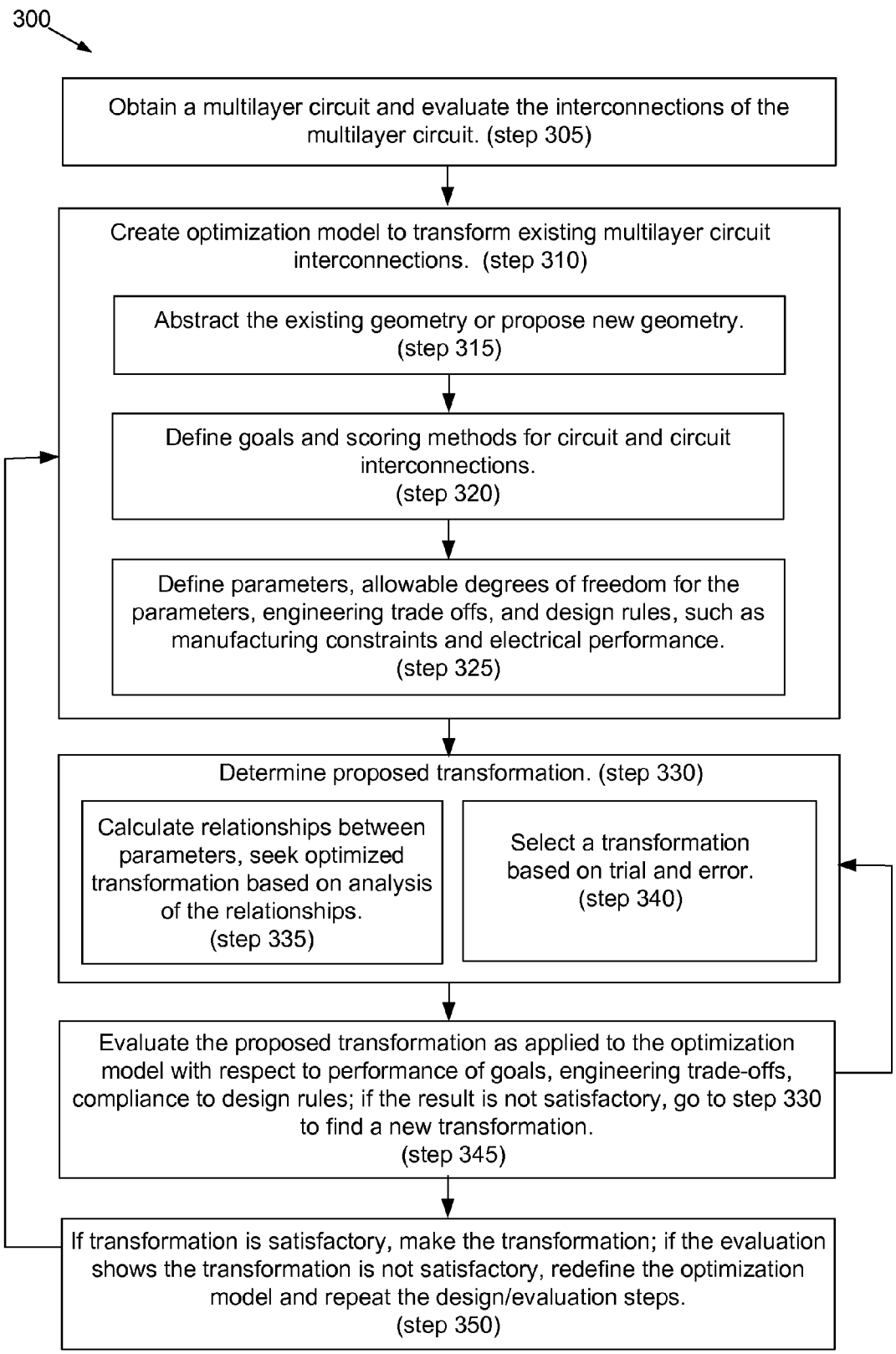
FIG. 3 is a flow chart of an illustrative method for transforming interconnections in a multilayer circuit, according to one embodiment of principles described herein.

FIG. 3 is a method (300) for transforming interconnections in a multilayer circuit to form an optimized circuit which meets one or more design goals or parameters. In a first step, a multilayer circuit is obtained and its interconnections are evaluated (step 305). This evaluation may include rating or scoring the interconnections of the multilayer circuit on a number of geometric or performance parameters. For example, the number, length, serial resistance, and capacitance of the interconnections could be determined.

An optimization model of the multilayer circuit is created to be used in the transformation of the existing multilayer interconnects (step 310). The creation of the optimization model may include any number of steps. For example, the geometry of the multilayer circuit may be abstracted to produce a simpler and/or more visual representation of the structure of the multilayer circuit (step 315). Additionally, a new geometry can be proposed for evaluation. By simplifying the geometry of the multilayer circuit in the optimization model, the visualization of the model can be more useful and optimization calculations can be more straight forward. Abstracting the existing geometry can be used to separate relevant aspects of the design from less relevant details which need not be addressed in the optimization model. A number of different abstractions could be used, which emphasize various aspects of the geometry and result in different transformations. For example, in some embodiments, the length of crossbar segments may be left out of the optimization model, while in other embodiments it may be important to include the length of the crossbar segments. In some illustrative embodiments, it may be useful to propose a new geometry for the interconnections.

In a next illustrative step, the goals and scoring methods for the multilayer circuit and its interconnections can be defined (step 320). For example, the purpose of the transformation may be to modify the circuit to perform a given task or to improve the multilayer circuit's performance. The goals could be based on the requirements for the task or performance. For example, the goals may include, but are not limited to: minimizing the series resistance; minimizing the stray capacitance; minimizing delay time; minimizing power dissipation; maximizing programmable crosspoint device densities; creating address space with no holes; uniquely addressing all programmable crosspoint devices in a multilayer circuit and other relevant factors. The scoring methods allow set ground rules for evaluating and comparing various designs.

Parameters, allowable degrees of freedom for the parameters, engineering trade-offs, and design rules may also be defined (step 325). The parameters may represent geometric shape, size, material, electrical performance, durability, and other relevant parameters. For example, these parameters may include the pitch for the CMOS layer; a different pitch for the crossbar wire layers; the number of crossbars to be stacked; or other relevant parameters. The allowable degrees of freedom for the parameters represent ranges through which the parameters may be conceivably varied. Design rules may include manufacturing constraints, size limitations, performance constraints, best practices, or other relevant considerations. The design rules may influence the allowable degrees of freedom for the various parameters. The engineering trade-offs may represent interplay between various requirements and parameters.

For example, a goal may be to create a memory circuit which has a given memory capacity and read/write time. One illustrative engineering trade off may be between the serial resistance/capacitance of an interconnection and its length. Longer interconnection lengths can produce access to larger amount of memory, but may increase the serial resistance/capacitance of the interconnection. This increase in serial resistance/capacitance can adversely affect the read/write time of the interconnection. The scoring method may include measuring or estimating the serial resistance/capacitance of the longest electrical interconnection.

The steps in creating an optimization model to transform existing multilayer interconnects are only illustrative examples. A number of additional steps or reordering of the steps could be used within the optimization model. For example, additional steps could be added or existing steps could be combined. Additionally, although the creation of an optimization model is presented as discrete steps, there can be significant interplay between various steps. For example, a performance design goal may be increased as the result of a discovery of new combination of parameters.

In a next step, the desired transformation is determined (step 330). The desired transformation may be determined in a number of ways. For example, relationships between various design parameters can be determined and an optimized transformation can be sought based on an analysis of those relationships (step 335). Several equations may be generated which relate various design parameters. These equations may be solved to produce an optimized solution.

Additionally or alternatively, a transformation may be selected based on trial and error evaluation (step 340). For example, a Monte Carlo calculation of various interconnection designs could be performed by repeated random selection of parameters. Monte Carlo simulations could be particularly useful in evaluating optimization models which have a large number of coupled degrees of freedom. A number other techniques could be used to select transformations, including, but not limited to, successive over-relaxation, hybrid Monte Carlo, Gibbs sampling, Multiple-try metropolis, Bayesian inference, and other techniques.

Design for manufacturability practices could also be used to create a proposed transformation. Design for manufacturability is a set of techniques which modify the design of an integrated circuit to make the circuit more manufacturable by improving its functional yield, parametric yield or reliability. For example, design for manufacturability techniques may be used to create a database of pre-optimized circuit units or transformations which could then be selected for incorporation into a given optimization process. Additionally, as part of the evaluation of a transformation, design for manufacturability measures could be used. For example, design for manufacturability measures such as functional yield loss could be performed. The transformation could be further optimized by substituting higher yielding cells, changing the spacing and width of interconnect wires, optimizing the amount of redundancy in the memory, or substituting fault tolerant/redundant vias in the design.

Further, the calculation of relationships between parameters (step 335) and trial and error methods (step 340) can be combined. For example, for relationships which can be more easily calculated, an optimized transformation could be sought by analysis. A trial and error method could be used to find optimized transformation for other parameters. This combined approach uses the different methods to their best advantage and may reduce the overall time and effort required to reach a satisfactory result.

The proposed transformation can then be evaluated with respect to the performance goals, engineering trade-offs, and compliance with the design rules by applying it to the optimization model (step 345). If the result is not satisfactory, the process can return to step 330 and determine the next proposed transformation. It is anticipated that for proposed transformations created by trial and error, steps 330, 340, and 345 would be performed iteratively. According to some embodiments, the evaluation of results of the proposed transformation may be used to provide guidance to the next trial and error selection.

If the transformation is satisfactory, the transformation of the multilayer circuit is made (step 350). However, if a satisfactory transformation is not found, the optimization model is redefined (step 310) and the design and evaluation steps are repeated. The criteria for evaluating if the transformation is satisfactory is based on the extent to which the transformed multilayer circuit meets the design goals defined in step 320.

Figure 4C:
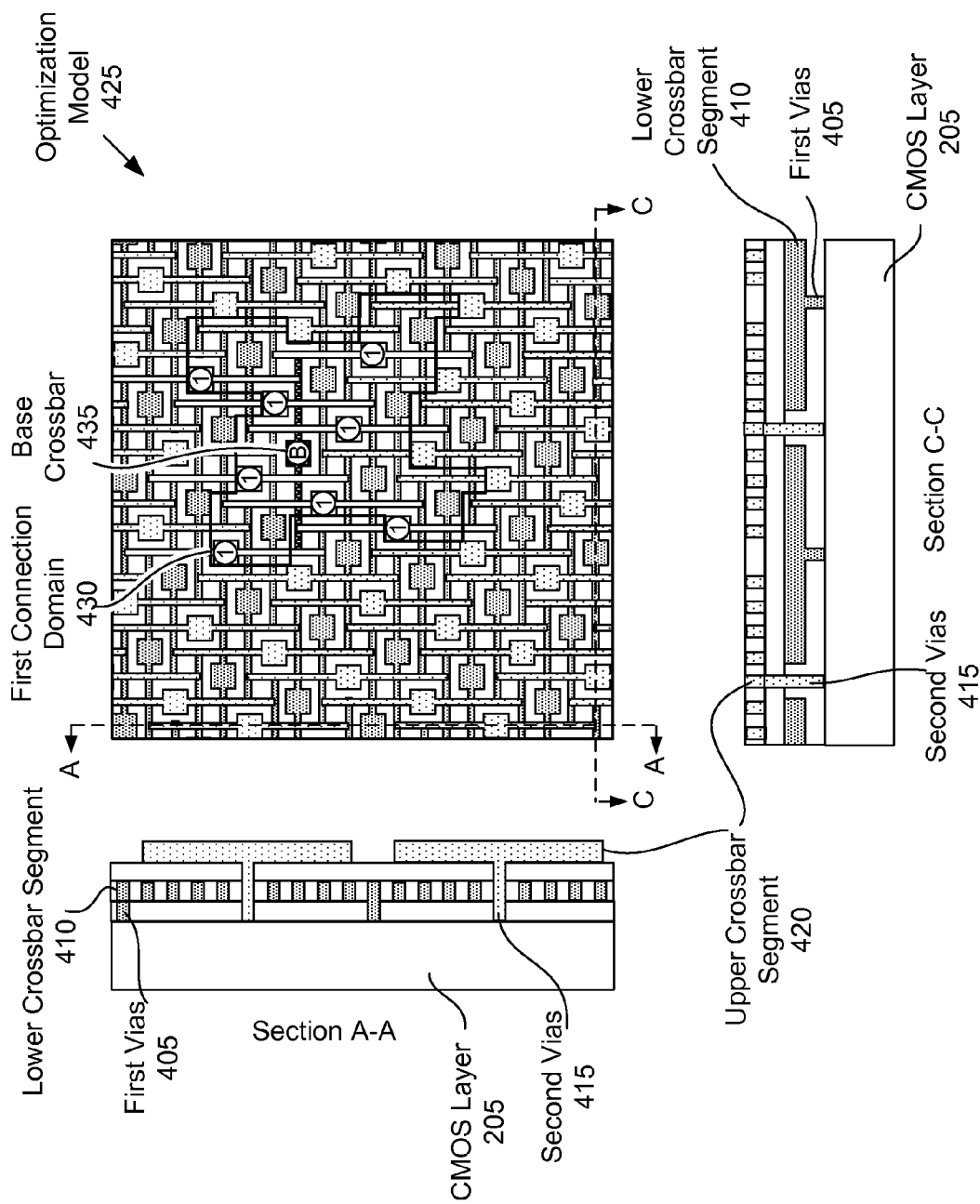

The following figures (FIGS. 4, 5, 6, and 7) show various implementations of the method for transforming circuit interconnections described in FIG. 3. FIG. 4A describes an illustrative crossbar array according to the Strukov embodiment, some of its various components, and an evaluation of its interconnections according to step 305 of FIG. 3. FIG. 4B describes an illustrative optimization model created to transform the existing multilayer circuit interconnections according to steps 310 and 315. FIG. 4C further describes illustrative abstractions of the existing geometry. FIG. 4D graphically illustrates various design rules and parameters for manipulating the model according to step 325 of FIG. 3. Throughout the discussion of FIGS. 4A, 4B, 4C, and 4D, various design goals and engineering trade-offs are discussed. Succeeding FIGS. 5, 6, and 7 show illustrative transformations which are made to the interconnections in the multilayer circuitry by continuing to follow the steps 325 through 350 as illustrated in FIG. 3.

FIG. 4A describes an illustrative crossbar array (400) which can be used to form a multilayer circuit. As discussed in FIGS. 1 and 2, the crossbar array may include a number of intersecting upper and lower crossbars. At each intersection, a programmable crosspoint device is interposed between the upper and lower crossbars.

To avoid crossbars with extremely long lengths, the crossbars may be divided into shorter segments, with each segment being electrically connected to a via. The lower segments (410) are connected to an array of first vias (405) and the upper segments (420) are connected to an array of second vias (415). To access a given programmable crosspoint device, the appropriate first via (405) and second via (415) are activated to create a reading or writing voltage across the programmable crosspoint device at the intersection between the upper and lower crossbar segments.

According to one illustrative embodiment, the four dimensional wiring scheme may uniquely address elements in higher crossbar levels by shifting the vias to a new connection domain. For example, in a first layer, a first via may connect to 8 second vias. In the second layer, the same first via may be shifted to connect to 8 different second vias, and so forth. However, to shift the via locations, a special intercrossbar layer is used in the Strukov circuit. This significantly increases the complexity of circuit, creates longer electrical paths, and adds manufacturing costs because of the extra physical masks and lithography steps.

FIG. 4B represents one illustrative optimization model (425) which is an abstraction of the existing geometry of the crossbar array (400, FIG. 4A). In this illustrative embodiment, the optimization model (425) incorporates several simplifications. First, the various angles in the crossbar array (400, FIG. 4A) are altered to allow for a presentation of the various components of the crossbar layer (400, FIG. 4A) in an orthogonal grid (445). The crossbar segments (410, 420) are represented as rectangular line segments and the vias (405, 415) shown as enlarged squares along the rectangular line segments. For example, a lower crossbar segment (410) and first via (405) are shown as darkly shaded rectangular line with a central enlarged square. Over the lower crossbar segment (410) an upper crossbar segment (420) is shown. The upper crossbar segment (420) is shown as a lightly shaded rectangular line with a central second via (415) as a lightly shaded rectangle which is centrally located on upper crossbar segment (420). One advantage of the optimization model (425) shown in FIG. 4B is that it focuses attention on the crossbars (410, 420) and allows the crossbars (410, 420) to be more easily visualized.

A grid (445) which is made of a number of cells (432) is used as a reference and may be linked to manufacturing constraints such minimum pitches. The grid (445) may also be sized to appropriately represent a repeating portion of the crossbar array (400, FIG. 4A). A number of upper and lower crossbars (410, 420) have been left off the grid (445) for purposes of illustration.

FIG. 4C shows several more views of the optimization model (425). The plan view shows a base crossbar (435) and its connection domain (430) within a first crossbar layer of the Strukov circuit. As used in the specification and appended claims, the term "connection domain" refers to the area of a crossbar layer which is defined by interconnections made with a selected base crossbar segment or via. For example in this illustrative embodiment, a base crossbar (435) has been selected. By tracing the various crossbar segments, it can be seen that each of the crossbars labeled with a "1" intersect the base crossbar (435). These intersecting crossbars are used in conjunction with the base crossbar (435) to address programmable crosspoint devices interposed at their intersections. Consequently, these intersecting crossbars define the connection domain (430) for the base crossbar (435).

FIG. 4C illustrates that in this particular wiring geometry, it may be difficult to use any of the crossbar segments to shift the connection domain (430) between stacked crossbar layers. For example, there is no room to connect vias between to the lower crossbar segments (410) to make vertical connections to different location in and upper layer. Thus, the only way to shift the vias (405, 415) to a new region and avoid making redundant connections in an overlying layer is to use an extra layer of metal traces to form the interconnection layer.

Section A-A and Section C-C are cross sectional diagrams of the optimization model (425) along the line A-A and line C-C in the plan view, respectively. These sections the CMOS layer (205) with vias (405, 415) extending upward to contact the crossbar segments. The first vias (405) connect to the lower crossbar segments (410). The only gaps in the upper crossbar segments (420) occur directly over the first vias (405). Consequently, if the first vias (405) were to be extended into an overlying crossbar array, they would be in the same location and interact with the same group of upper vias.

As a result, an interwiring layer was used in the Strukov circuit to shift via connections of the lower crossbar arrays so that in a second layer the first via is connected to a lower crossbar which intersects with 8 different upper crossbar layers. Consequently, the combination of via "B" and 8 different second vias can be used to address 8 additional programmable crosspoint devices in the overlying crossbar array. This shifting process is performed by wiring interlayers between each crossbar array and allows for unique addressing of the various crosspoint memory devices in the multilayer circuit.

One of the design goals of the transformation is to maintain the overall interconnection scheme which uses shifted connection domains but to eliminate the wiring interlayers. FIG. 4D is a chart that shows some illustrative parameters (450) with examples of allowable degrees of freedom, design rules, and optimization goals which can be incorporated into the optimization model (425, FIG. 4C) and used to produce and evaluate transformations of the model.

A unit cell (450-1) is a visualization tool which creates a regular grid like pattern and allows the elements within a given crossbar layer to be conceptually placed and segmented. For purposes of illustration, the unit cells (450-1) may or may not be actually drawn in a given figure. The unit cell (450-1) selected for this particular optimization model is a square, which indicates that there are four directions in which crossbars can enter or leave the unit cell (450-1). The unit cell (450-1) could have any number of sides. For example, the unit cell (450-1) may also be a triangle, rectangle, pentagon, hexagon, or other polygon. In some embodiments, the unit cell (450-1) may be a circle, indicating that crossbars or other elements could enter or leave the unit cell at any arbitrary angle. According to one illustrative embodiment, a unit cell (450-1) may only contain a via connected to a crossbar, a portion of a crossbar or an intersection between two vias. These assumptions may also be changed based on the definition of a cell and manufacturing limitations.

The vias (450-2) are connected to crossbars and are represented as squares. In this illustrative optimization model, there are two types of vias (450-2): first vias, which are shown as darkly shaded squares and are connected to lower crossbars and second vias, which are shown as lightly shaded squares and are connected to upper crossbars. There are no restrictions on the relative locations of the first vias and second vias (450-2), except that they cannot occupy the same unit cell and must be attached to their respective crossbars.

Two types of crossbars (450-3) are shown: an upper crossbar is shown as a lightly shaded rectangle which always extends in a north/south direction and a lower crossbar is shown as a darkly shaded rectangle which always extends in an east/west direction. These assumptions may also be altered as desired. For example, the number of crossbar types, the orientation of the crossbars, etc. can be altered.

The via/crossbar connection (450-4) is illustrated as a square box superimposed on the rectangular crossbar. The square box represents the via which is connected to the crossbar. In this model (425, FIG. 4C), the via interconnection (450-2) on both the upper crossbars and the lower crossbars can be made anywhere along the length of the crossbar. The use of this particular degree of freedom, among others, is demonstrated in the following figures and results in several improvements in the performance of the multilayer circuit.

Crossbar intersections (450-5) occur within unit cells where one upper crossbar passes over a lower crossbar. As discussed above, a programmable crosspoint device is sandwiched between the two intersecting crossbars.

In this illustrative model (425, FIG. 4C), the crossbar length (450-6) is fixed for all layers and is the same for both the upper and lower crossbars. Further, for purposes of illustration, the crossbar length (450-6) is illustrated as being extending through 9 unit cells. Although the crossbar lengths (450-6) are not varied in this particular model, the crossbars lengths (450-6) could be altered in a number of ways. For example, the crossbar segments could be lengthened to extend through a larger portion of the crossbar layer and/or the upper and lower crossbars segments could have different lengths. It is not necessary for both upper and lower crossbar segments in any single crossbar array to be the same length.

The optimization model (425, FIG. 4C) may introduce a number of new elements which are not found in the original crossbar array (400). For example, where the crossbars are used to shift the connection domain between layers, a "shift pin" (450-7, 450-8) can be connected to the crossbar. The shift pin (450-7, 450-8) is a via which connects a first crossbar segment in one crossbar array to a second crossbar segment in another overlying crossbar array. To shift the connection domains, the first crossbar segment and second crossbar segment are at different relative locations in their respective layers. The shift pins (450-7) which connect to the upper crossbar segments are illustrated as circles with slanted line shading. The shift pins (450-8) for lower crossbars are illustrated with cross hatching. In this illustrative optimization model (425, Fig. C), the shift pins (450-7, 450-8) may connect anywhere along the length of the crossbars.

A connection domain (450-9) is a graphic representation of the total area which is interconnected to a given crossbar. For example, if a given lower crossbar intersects with 8 upper crossbars, the connection domain of the lower crossbar would encompass portions of the 8 upper crossbars. One goal of this optimization model (425, FIG. 4C) is to maximize the connection domain size in a given layer.

A shifted connection domain (450-10) is the connection domain of the same via/crossbar in the next layer. One goal of this optimization model (425, FIG. 4C) is to maximize the number of new connections made in the next layer. To maximize the number of new connections, the new connection domain in an overlying layer should not overlap the original connection domain in the underlying layer. Additionally, there should not be any gaps between the shifted connection domain and the original connection domain.

Various transformations can be made based on one or more of the parameters. For example, a variety of different interconnection patterns can be generated based on the length of the crossbar segments, the location of vias and shift pins along the crossbar segments, the geometric layout of the vias, and the degree to which the symmetries are broken.

Figure 5A:
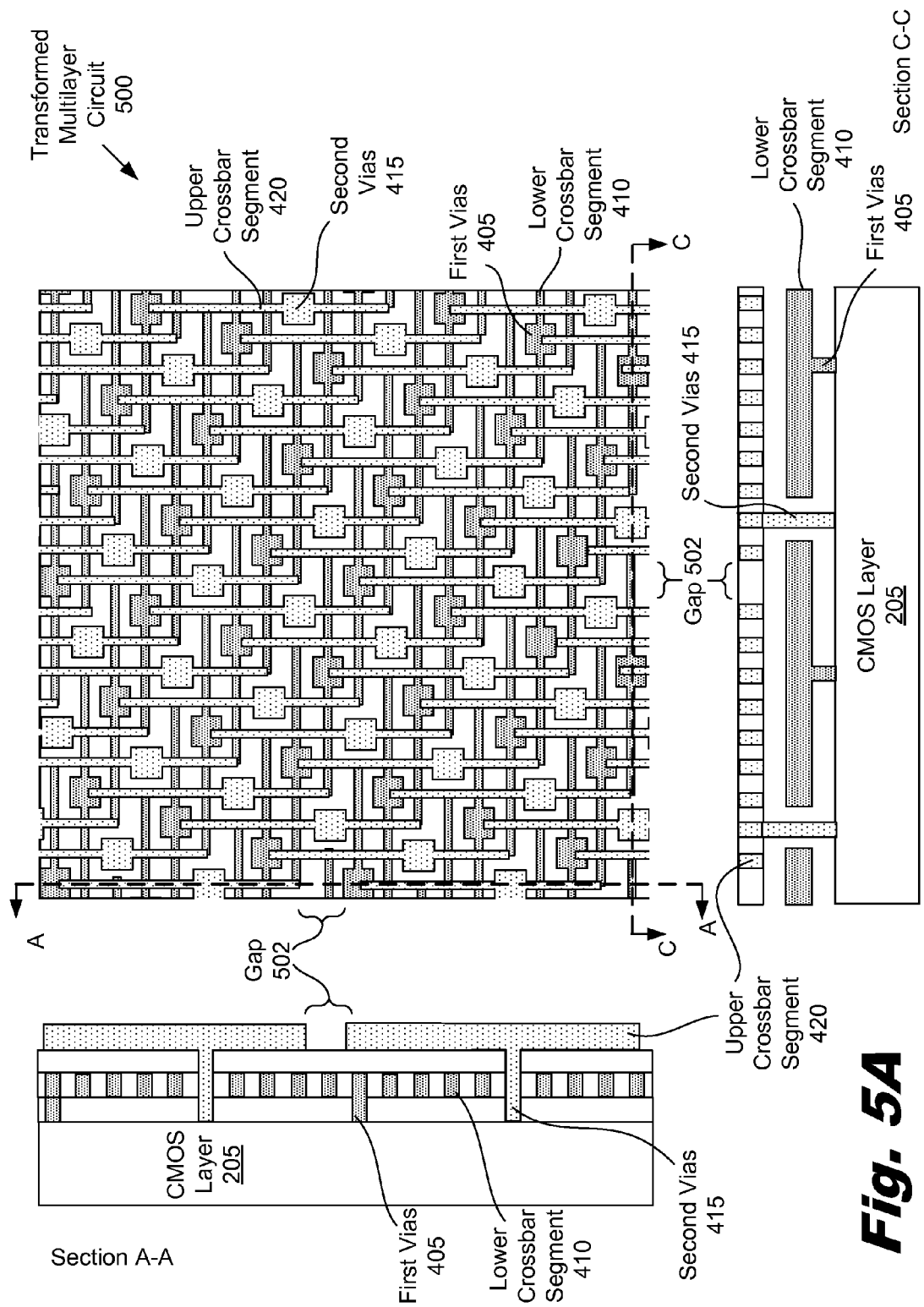
FIGS. 5A, 5B, and 5C are diagrams of an illustrative transformed multilayer circuit, according to one illustrative embodiment of principles described herein.

FIG. 5A is a diagram of several views of an illustrative transformed multilayer circuit (500) which is a transformation of the crossbar array shown in FIGS. 4A-4C. One of the design goals for this transformation is to eliminate the inter-crossbar wiring layer (260, FIG. 2) and use the crossbar segments (410, 420) themselves to shift the interconnection domains between layers. The first step is to break the symmetry of the crossbar segments and via connections used in the Strukov circuit. In the original Strukov scheme illustrated in FIGS. 4A-4C, the connection of a crossbar segment to a via occurs in the middle of the crossbar segment. The via connections are made at the center of the crossbar segments and the crossbar segments extend through unit cells (e.g. makes four cross point connections) on either side of the via connection. Comparing FIG. 5A with FIG. 4A shows that the symmetry of the upper crossbar segments (420) has been changed. Now, instead of the second via (415) being in the middle of the upper crossbar segment (420), the via connection (415) to the upper crossbar segments (420) occurs one unit cell displaced from the center. Section A-A shows that there are five unit cells above the via (415) connection to the upper crossbar segment (420) and only three below. As shown in section C-C, the first via (405) connection to the lower crossbar segment (410) is unchanged. The net result of breaking the symmetry is that there are now unit cells that contain only lower crossbars. These are locations where a new via can be attached to the lower crossbars (410) to make an electrical connection through a gap (502) in the upper crossbar segments (420) to a lower crossbar segment (410) the next layer up.

Figure 5B:
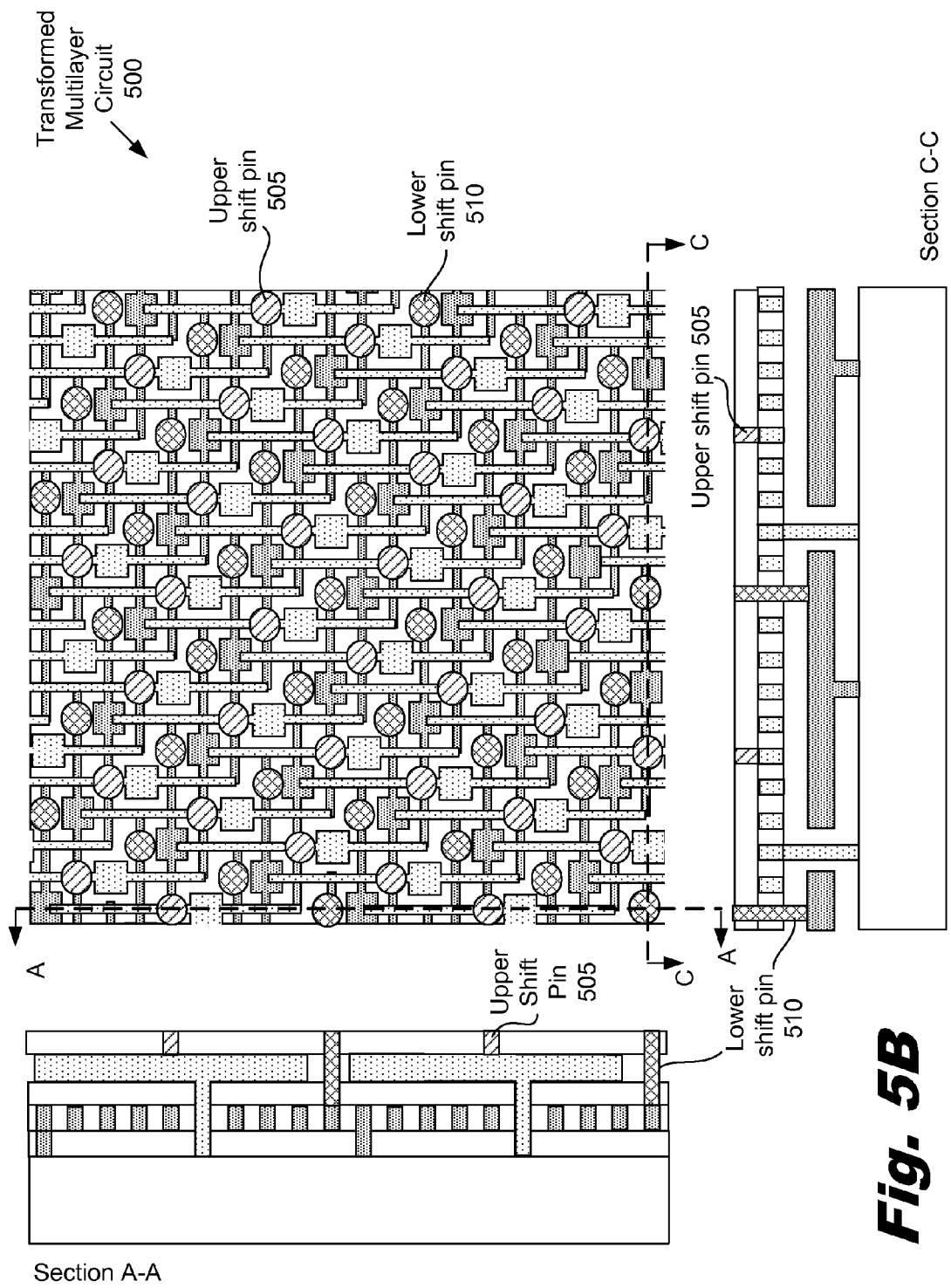

FIG. 5B shows the transformed multilayer circuit (500) with the upper (505) and lower shift pins (510) in place. Section C-C shows how the interconnection made through the lower crossbar (410, FIG. 5A) is effectively translated to the right by three unit cells by the lower shift pins (510) connecting it to a lower crossbar (410, FIG. 5A) in an overlying crossbar layer. Similarly, section A-A shows the upper crossbars (420, FIG. 5A) are shifted vertically one unit cell by the upper shift pins (505). No extra wiring layer is required to translate the connection domain to a new location in the overlying layer. The resulting net displacement between the connection domains in adjacent layers is three unit cells to the right and one unit cell up.

Figure 5C:
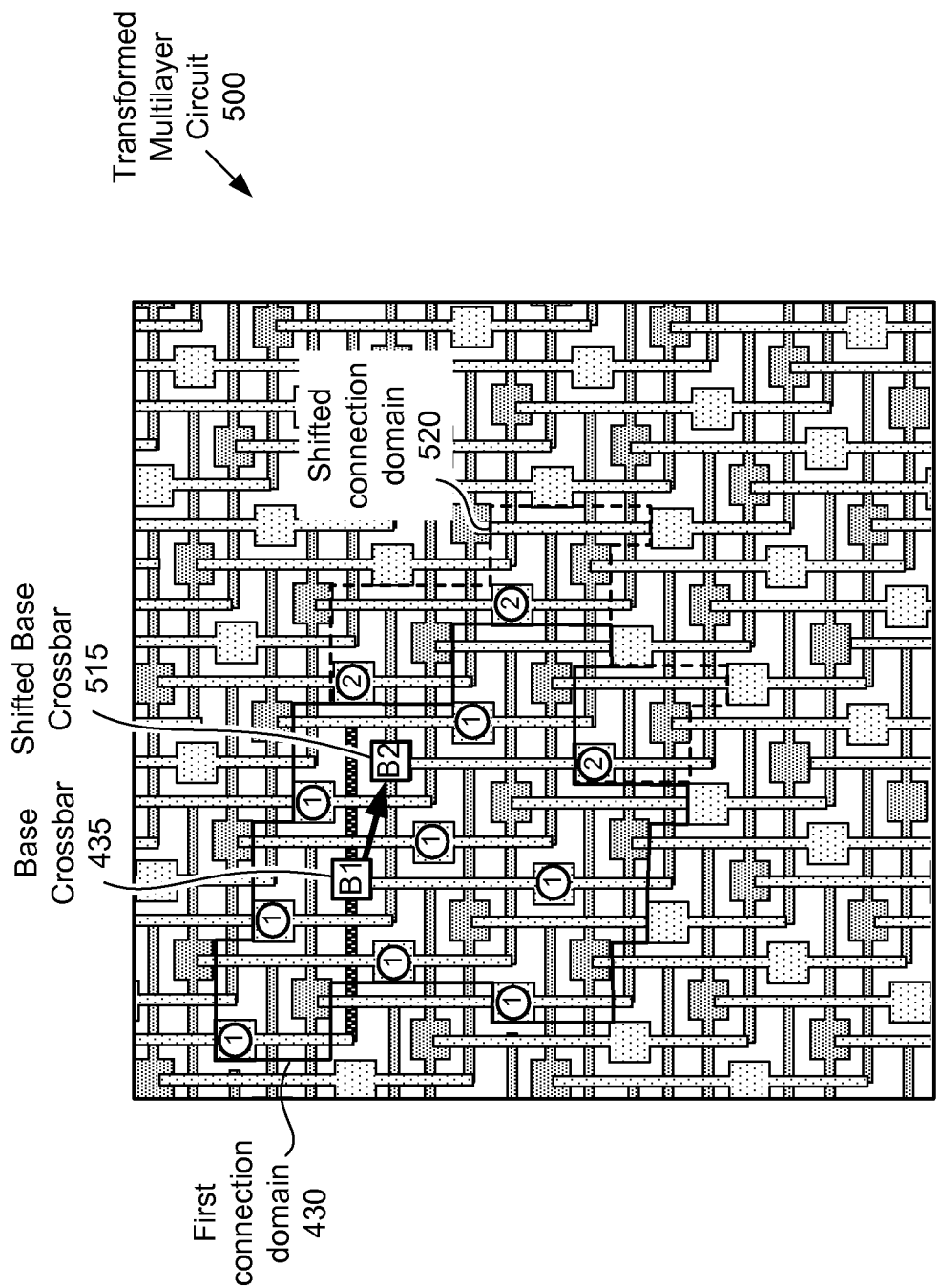

FIG. 5C shows the shifted connection domains between layers. As discussed above with respect to FIG. 5B, the connection domain (430) is shifted by electrically connecting crossbars in the upper layer to lower crossbars using the shift pins (505, 510; FIG. 5B). For clarity, FIG. 5C does not show the upper and lower shift pins (505, 510; FIG. 5B) but shows the shift which occurs as a result of the connections made between crossbar segments by the shift pins (505, 510; FIG. 5B).

A base crossbar (435) labeled "B1" is selected in the first crossbar layer. The first connection domain (430) includes the vias of all crossbars which intersect with the base crossbar (435) in the first crossbar layer. In the present example, the base crossbar (435) intersects the upper crossbars labeled "1", indicating that the intersections are made in the first crossbar layer. As shown in the drawing there are 8 connections made in the first connection domain for the base crossbar (435) "B1." Consequently, by electrically selecting the base via and one of the vias of the 8 intersecting crossbars, any one of eight programmable crosspoint devices can be read or programmed.

As discussed above, there is a net displacement of the lower crossbars with respect to the upper crossbars of three unit cells to the right and one up in the adjacent overlying layer as a result of connections made by the shift pins. This results in a new and shifted connection domain (520) in which the shifted base crossbar (515) makes connections with a number of new vias. In this particular example, three additional connections are made in the overlying layer. These three connections are made to vias labeled "2" and are surrounded by dashed lines. However, because the lateral shift of the base crossbar (435) is not very great, the shifted connection domain (520) significantly overlaps the first connection domain (430). This result is less than satisfactory because only three new connections were made out of a possible total of eight, and thus most of the crosspoint devices in the overlying layer would be wasted because they would be redundant.

Again referring to the steps listed on FIG. 3, the above evaluation of the transformation (step 345) indicates that at least one design goal was not met, specifically, maximizing the new connections in the shifted connection domain (520). Three new connections out of 8 possible new connections is not satisfactory, consequently, the process moves back to step 330 and a new transformation is determined. This new transformation is illustrated in FIGS. 6A and 6B.

Figure 6A:
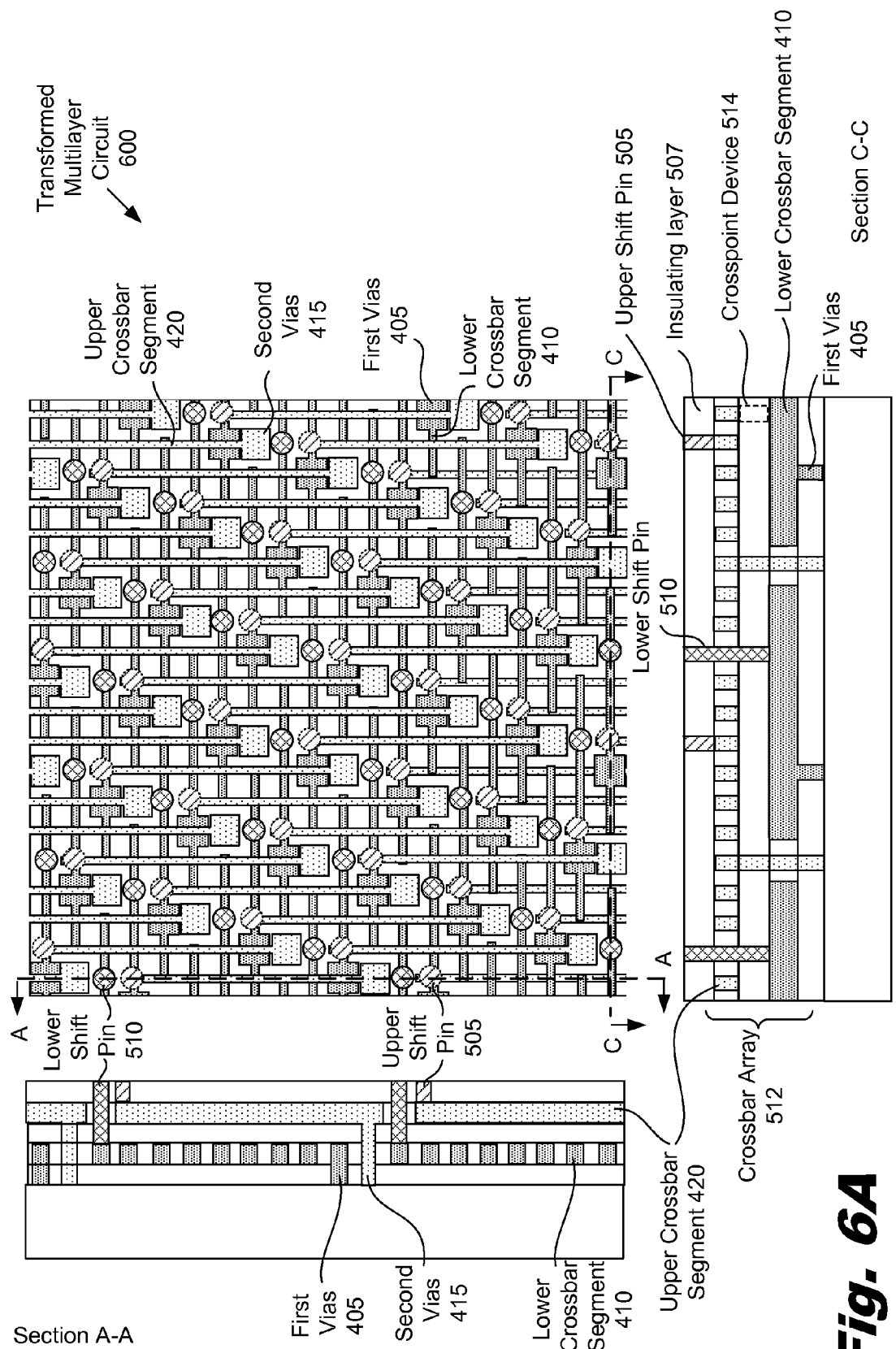
FIGS. 6A and 6B are diagrams of an illustrative transformed multilayer circuit, according to one illustrative embodiment of principles described herein.
Figure 7:
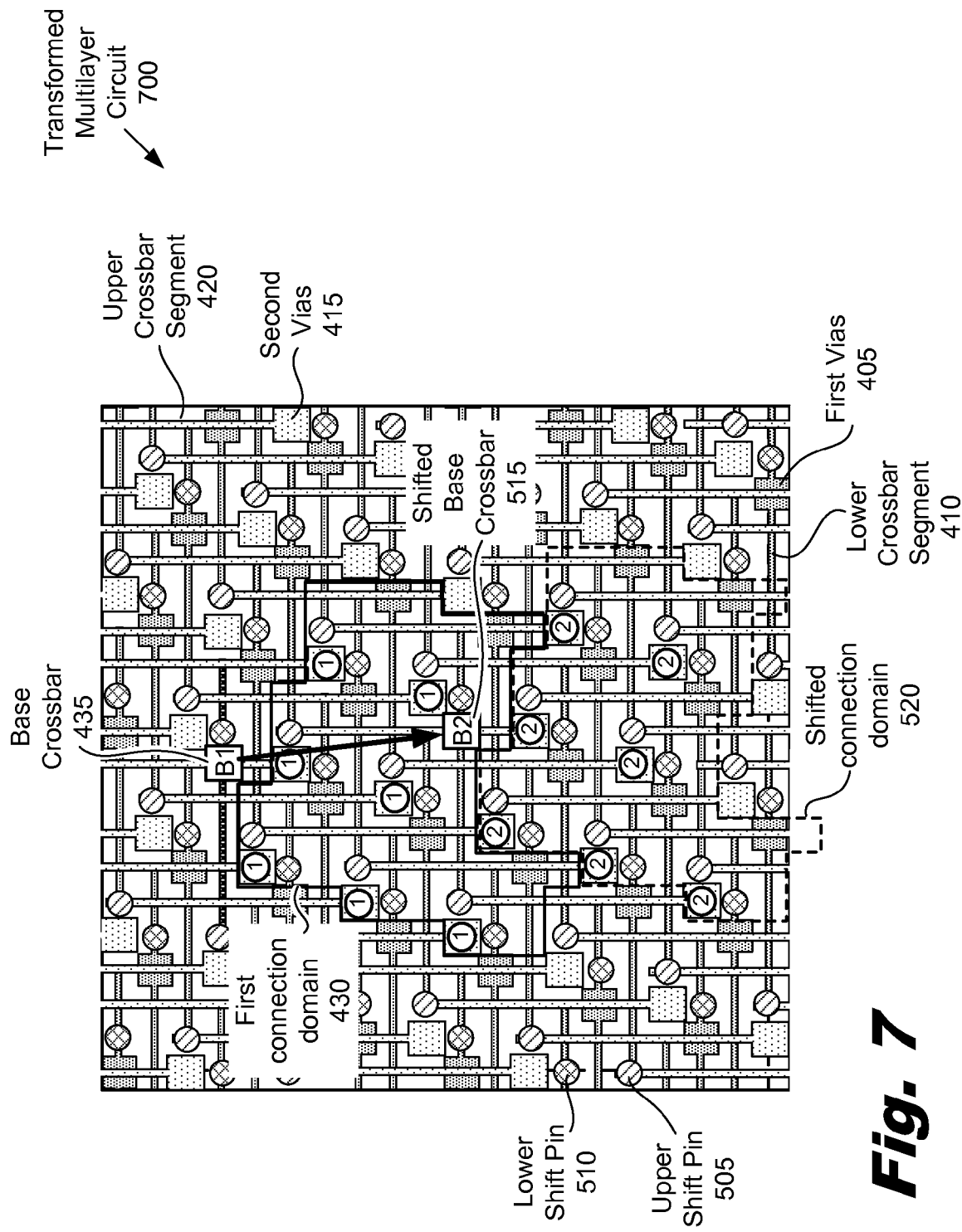
FIG. 7 is a diagram of an illustrative transformed multilayer circuit, according to one embodiment of principles described herein.

FIG. 6A shows a top view and cross sectional views of an illustrative transformed multilayer circuit (600). Like the embodiments described above, this transformed multilayer circuit (600) includes a plurality of stacked crossbar arrays (512) which are separated by insulating layers (507). A number of shift pins (505, 510) pass vertically through the insulating layer (507) and make connections between the crossbar segments (410, 420) in a first crossbar array (512) and an overlying crossbar array. In this embodiment, lower shift pins (510) connect lower crossbar segments (410) in the first crossbar array (512) to lower crossbar segments in an overlying layer. Similarly, the upper shift pins (505) connect the upper crossbar segments (420) in the first crossbar array (512) to upper crossbar segments in an overlying layer. Programmable crosspoint devices (514), illustrated as dashed rectangles, are interposed at intersections between the upper crossbar segments (420) and the lower crossbar segments (410). For clarity, the majority of the programmable crosspoint devices (514) in the crossbar array (512) are not illustrated.

In FIGS. 5A-5C, the symmetry of the connection between the vias and the crossbar segments was broken. In FIG. 6A, another type of symmetry is broken. In this case, instead of having all of the pins from the bottom CMOS layer (205) on a regular grid, they are positioned in adjacent unit cells. This enables both the lower and the upper crossbar segments (410, 420) and vias (405, 415) to be asymmetric. In this case, the upper crossbar segments (420) have the second vias attached at one end. As shown in section C-C, the first vias (405) are also shifted to one side of the lower crossbar segments (410). This results in two unit cells to the left of the first via (405) attachment to the lower crossbar segment (410) and six boxes to the right. The gaps above the lower crossbar segments (410) are populated with lower shift pins (510) and the upper shift pins (505) are located on the end of the upper crossbars (420) opposite the connection with the second vias (415). This results in a structure which has a net displacement of the lower crossbars with respect to the upper crossbars which 8 cells up and 4 cells to the right.

Figure 6B:
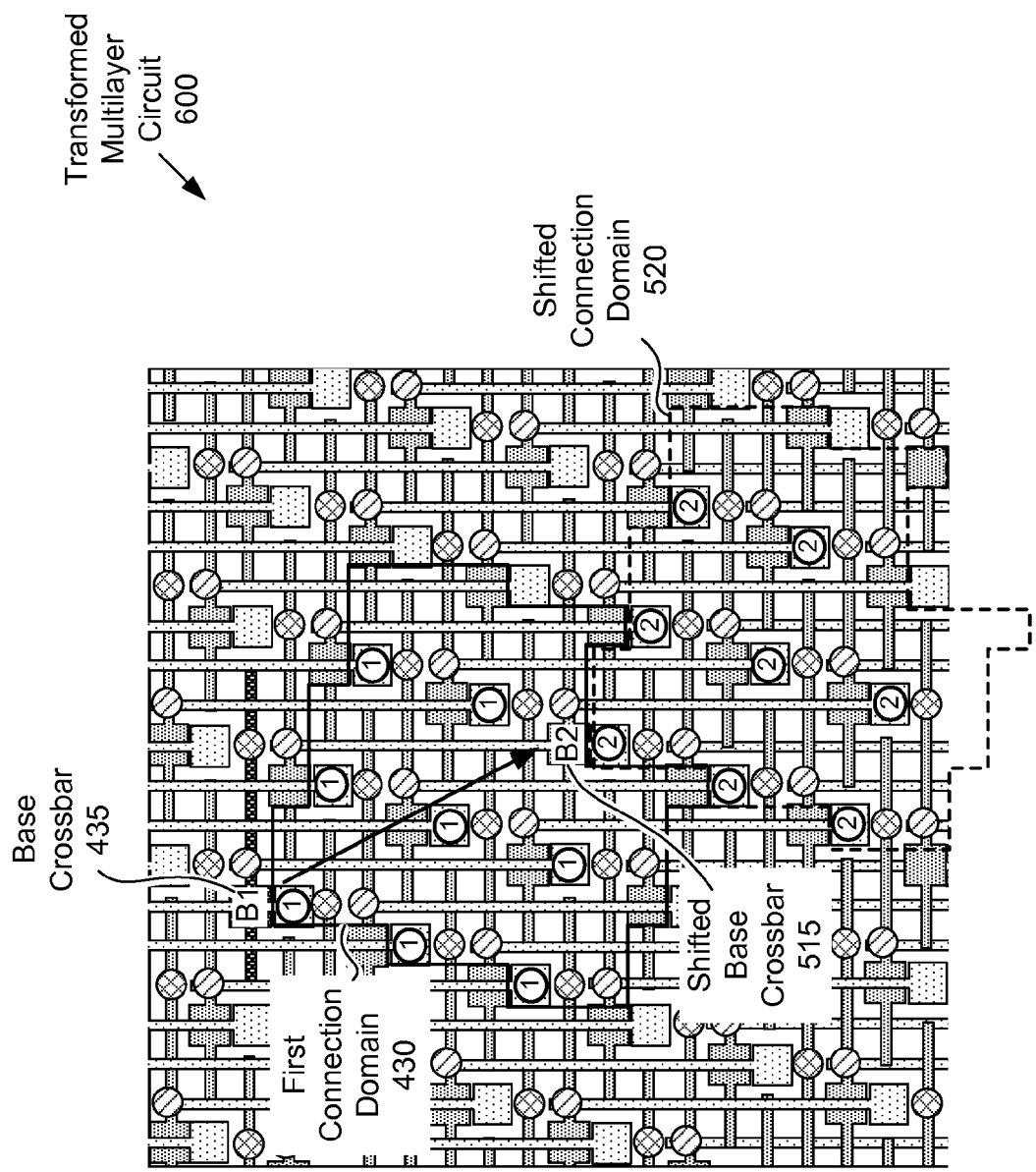

FIG. 6B shows a first connection domain (430) which is made between a base crossbar (435) and eight intersecting crossbars. As discussed above, this allows any one of eight programmable crosspoint devices which are located between the intersections to be read or programmed. The shifted connection domain (520) is displaced eight cells vertically and four cells to the right. This displacement is sufficient to shift the connectivity domain so that there are eight new connections in the shifted connection domain (520). Consequently, there are no wasted programmable crosspoint devices (514, FIG. 6A) in the overlying layers and all of the programmable crosspoint devices (514, FIG. 6A) are uniquely addressable. In the first layer, the first via connected to the lower base crossbar (435) can be used in combination with any of the second vias (labeled "1") attached to the eight intersecting upper crossbars to address eight programmable crosspoint devices (514, FIG. 6A). In the overlying layer, the same first via can be used in combination with eight different second vias (labeled "2") to access eight different programmable crosspoint devices (514, FIG. 6A).

In addition to providing eight new connections in each overlying layer, the connection domains in the transformed multilayer circuit (600) do not have any gaps between the connection domains. This provides for substantially complete coverage of the crossbar array and allows the connection domains to be efficiently tiled across the crossbar array.

FIG. 7 is a diagram of an illustrative transformed multilayer circuit (700). In this embodiment, an additional design parameter has been incorporated into the transformation process. This additional design parameter states that to minimize capacitance between first and second vias (405, 415), the first and second vias (405, 415) should not be vertically or horizontally adjacent. The incorporation of this additional parameter can result in a number of embodiments, including the transformed multilayer circuit (700). In this illustrative embodiment, the first and second vias (405, 415) are not vertically or horizontally adjacent. Instead, the second vias (415) are located to the left one unit cell and up one unit cell from the first vias (405). This diagonal repositioning of the first vias and second vias (405, 415) can significantly decrease their mutual capacitance.

The transformed multilayer circuit (700) has a first connection domain (430) in which a base crossbar (435) intersects eight upper crossbar segments (labeled "1"). Using the upper and lower shift pins (505, 510), the shifted connection domain (520) is translated seven unit cells down and one unit cell to the right. The shifted connection domain (520) makes seven new connections in the overlying layer with seven different upper crossbars segments (labeled "2"). This is less than the ideal because less than eight new connections are made in the overlying layers. However, the design may be an acceptable tradeoff between maximizing the number of new connections and reducing the capacitance between the first vias (405) and second vias (415).

The method of shifting the connection domain (430) in overlying layers can be replicated any number of times to connect an arbitrary number of crossbar layers on top of each other. Further, the direction of the translation of the connection domains can be altered to provide a more complete coverage over the various connection domains. Another technique may be to rotate the entire pattern of the overlying layer with respect to the lower layers.

In sum, the transformation method described above is adapted to generate a very large number of different interconnection patterns. These interconnection patterns laterally shift connectivity domains in every crossbar array without interposing a wiring layer between crossbar layers. These different interconnection patterns provide access to a large number of addressable crosspoints throughout a multilayer circuit. The configurations of these patterns can depend on a number of factors, including the design parameters and goals.

The structural examples given above are not intended to be exhaustive. Rather, the structural examples are merely illustrative embodiments of multilayer circuits which can be produced by following the transformation method described above. The steps in the transformation method can be incorporated into an automated algorithm which optimizes the interconnection architecture for a multilayer circuit for a given set of constraints and variables. This transformation method produces three dimensional multilayer circuits which can be used, for example, to form very high density digital memories, dramatically improve the density of field programmable logic, and create bio-inspired adaptive circuitry.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A three dimensional multilayer circuit comprising:
a plurality of crossbar arrays, each crossbar array comprising intersecting crossbar segments;
programmable crosspoint devices interposed between the intersecting crossbar segments; and
shift pins configured to shift connection domains of the intersecting crossbar segments between crossbar arrays such that the programmable crosspoint devices are uniquely addressed; the shift pins being configured to make electrical connections between crossbar arrays by passing vertically between crossbar segments in a first crossbar array to make electrical connection with crossbar segments in a second crossbar array.

2. The circuit of claim 1, in which the shift pins comprise:
upper shift pins connected to upper crossbar segments in stacked crossbar arrays; and
lower shift pins connected to lower crossbar segments in stacked crossbar arrays.

3. The circuit of claim 2, in which the lower shift pins extend from lower crossbar segments in the first crossbar array to a lower crossbar segments in the second crossbar array through gaps where the upper crossbar segments do not intersect the lower crossbar segments.

4. The circuit of claim 2, in which the connection domains are shifted through a combination of a lateral shift between upper crossbars segments in the first crossbar array and upper crossbars in the second crossbar array; and a lateral shift between lower crossbars in the first crossbar array and lower crossbars in a second crossbar array.

5. The circuit of claim 4, in which the lateral shift between lower crossbar segments comprises connecting a first via at a first location on a lower crossbar segment and connecting a lower shift pin at a second and different location on the lower crossbar segment, the lower shift pin forming an electrical connection between lower crossbar segments in adjacent stacked crossbar arrays.

6. The circuit of claim 1, in which the first crossbar array and the second crossbar array are separated by a single layer which comprises an insulating matrix and vertical shift pins.

7. The circuit of claim 1, in which connection domains in the first crossbar array and connection domains in the second crossbar array have the same size and shape.

8. The circuit of claim 1, in which the number of vias and shift pins does not increase as the number of crossbar arrays in the multilayer circuit increase.

9. The circuit of claim 1, wherein each shift pin extends from a crosspoint at which there is a gap in a crossbar of the first crossbar array such that the shifting pin passes vertically through said gap between crossbar segments in the first crossbar array to make electrical connection with a crossbar in a second crossbar array.

10. A three dimensional multilayer circuit comprising:
a plurality of crossbar arrays, each crossbar array comprising intersecting crossbar segments;
programmable crosspoint devices, each interposed at a crosspoint between the intersecting crossbar segments; and
shift pins configured to shift connection domains of the intersecting crossbar segments between different crossbar arrays such that the programmable crosspoint devices are uniquely addressed;
wherein each shift pin extends from a crosspoint at which there is a gap in a crossbar of a first crossbar array such that the shifting pin passes vertically through said gap between crossbar segments in the first crossbar array to make electrical connection with a crossbar in a second crossbar array.

11. The circuit of claim 10, in which the shift pins comprise:
upper shift pins connected to upper crossbar segments in stacked crossbar arrays; and
lower shift pins connected to lower crossbar segments in stacked crossbar arrays.

12. The circuit of claim 10, in which the first crossbar array and the second crossbar array are separated by a single layer which comprises an insulating matrix and vertical shift pins.

13. The circuit of claim 10, in which connection domains in the first crossbar array and connection domains in the second crossbar array have the same size and shape.

* * * * *